US009570814B2

(12) United States Patent
Ando

(10) Patent No.: US 9,570,814 B2

(45) Date of Patent: Feb. 14, 2017

(54) STRUCTURE, ANTENNA, COMMUNICATION DEVICE AND ELECTRONIC COMPONENT

(75) Inventor: Noriaki Ando, Tokyo (JP)

(73) Assignee: NEC CORPORATION, Tokyo (JP)

( * ) Notice: Subject to any disclaimer, the term of this patent is extended or adjusted under 35 U.S.C. 154(b) by 917 days.

(21) Appl. No.: 13/062,452

(22) PCT Filed: Sep. 11, 2009

(86) PCT No.: PCT/JP2009/004543
§ 371 (c)(1), (2), (4) Date: Mar. 4, 2011

(87) PCT Pub. No.: WO2010/029770
PCT Pub. Date: Mar. 18, 2010

(65) Prior Publication Data

US 2011/0170267 A1 Jul. 14, 2011

(30) Foreign Application Priority Data

Sep. 11, 2008 (JP) ................................ 2008-233359

(51) Int. Cl.

| | |
|---|---|
| ***H05K 1/00*** | (2006.01) |
| ***H05K 1/18*** | (2006.01) |
| ***H05K 7/00*** | (2006.01) |
| ***H01Q 21/00*** | (2006.01) |
| ***H01Q 9/30*** | (2006.01) |
| ***H01Q 15/14*** | (2006.01) |

(Continued)

(52) U.S. Cl.
CPC ............ *H01Q 21/0031* (2013.01); *H01Q 9/30* (2013.01); *H01Q 15/006* (2013.01); *H01Q 15/0086* (2013.01); *H01Q 15/14* (2013.01); *H01Q 21/061* (2013.01)

(58) Field of Classification Search
USPC .......... 361/761–763, 782–784; 343/700 MS, 343/756, 848, 909–913; 340/700 MS, 909
See application file for complete search history.

(56) References Cited

U.S. PATENT DOCUMENTS 6,262,495 B1 * 7/2001 Yablonovitch et al. ...... 307/101
6,411,261 B1 * 6/2002 Lilly .................... H01Q 15/008 342/5
6,518,930 B2 2/2003 Itoh et al.
(Continued)

FOREIGN PATENT DOCUMENTS

JP 2005538623 A 12/2005
JP 2008010859 A 1/2008
(Continued)

OTHER PUBLICATIONS

International Search Report for PCT/JP2009/004543 mailed Dec. 22, 2009.

*Primary Examiner* — Tuan T Dinh

(57) ABSTRACT

A structure includes a first conductor pattern, a second conductor pattern, and a plurality of first openings and a plurality of lines. The first conductor pattern has a sheet shape. The second conductor pattern has a sheet shape and is opposite to the first conductor pattern, at least in part. The plurality of first openings are provided in the first conductor pattern. The lines are provided in the first openings, respectively, and one end thereof is connected to the first conductor pattern. Unit cells each containing the first opening and the line are repeatedly arranged.

11 Claims, 24 Drawing Sheets

(51) Int. Cl.

| | |
|---|---|
| ***H01Q 21/06*** | (2006.01) |
| ***H01Q 15/00*** | (2006.01) |

(56) References Cited

U.S. PATENT DOCUMENTS

| | | | | |
|---|---|---|---|---|
| 7,215,301 | B2 | 5/2007 | Choi et al. | |
| 2005/0029632 | A1* | 2/2005 | McKinzie et al. | 257/665 |
| 2005/0134522 | A1* | 6/2005 | Waltho | H01Q 1/28 343/909 |
| 2007/0090398 | A1 | 4/2007 | McKinzie, III | |
| 2007/0176827 | A1 | 8/2007 | Itoh et al. | |
| 2009/0135570 | A1* | 5/2009 | Chou et al. | 361/782 |
| 2009/0295665 | A1* | 12/2009 | Orton et al. | 343/793 |

FOREIGN PATENT DOCUMENTS

| | | | |
|---|---|---|---|
| JP | 2008131505 | A | 6/2008 |
| JP | 2008131509 | A | 6/2008 |
| JP | 2008147763 | A | 6/2008 |

* cited by examiner (a)

(b)

A-A'

(a)

(b)

(a)

(b)

(a)

(b)

(a) CROSS-SECTIONAL VIEW OF SIGNAL INTERCONNECT AND RETURN PATH
(WHEN FUNCTIONING AS RETURN PATH)

(b) CROSS-SECTIONAL VIEW OF SIGNAL INTERCONNECT AND RETURN PATH
(WHEN NOT FUNCTIONING AS RETURN PATH)

STRUCTURE, ANTENNA, COMMUNICATION DEVICE AND ELECTRONIC COMPONENT

The present application, is the National Phase of PCT/JP2009 004543, filed
Sep. 11, 2009, which claims priority based on Japanese patent application No. 2008-233359 filed on Sep. 11, 2008.

TECHNICAL FIELD

The present invention relates to a structure having characteristics of a metamaterial, an antenna, a communication device and an electronic component.

BACKGROUND ART

In recent years, there has been proposed, as described in Patent Documents 1 to 4, for example, a metamaterial that artificially controls a dispersion relationship of an electromagnetic wave propagating in a structure by periodically arranging conductor patterns or conductor structures. For example, a metamaterial, which is controlled such that a wavelength of the electromagnetic wave is remarkably shortened, is used thereby to enable a resonator antenna to be reduced in size. Further, when a metamaterial structure that controls electromagnetic wave propagation in a certain frequency band (electromagnetic Band Gap: which will be denoted as EBG below) is used, an electromagnetic interference between circuits due to unwanted electromagnetic wave propagation from a high frequency circuit can be prevented.

For example, Patent Document 1 discloses therein a small-sized antenna structure utilizing a composite right and left handed (CRLH) line as one form of a metamaterial. A decode line in the antenna disclosed in Patent Document 1 is configured with periodically arranging unit cells each containing a conductor plane, a conductor patch arranged in parallel with the conductor plane, and a conductor via for connecting between the conductor plane and the conductor patch. Further, Patent Document 1 discloses therein that a conductor element is provided between the conductor plane and the conductor patch to increase a capacity between the adjacent conductor patches in order to be operated as a left handed medium at a lower frequency side. Furthermore, for a similar purpose, there is disclosed that a slit is provided near the connection part between the conductor plane and the conductor via to form a coplanar line, thereby increasing an inductance between the conductor plane and the conductor patch.

Additionally, Patent Document 2 discloses several EBG structures therein. For example, FIG. 4 illustrates cross-section configurations of a resonance via-type EBG structure and equivalent circuits per unit cell, respectively. FIGS. 1 and 2 illustrate top views of an inductive grid-type EBG structure, and FIG. 5 illustrates equivalent circuits per unit cell of the inductive grid type EBG structure, respectively.

Patent Document 3 discloses therein a uniplanar compact photonic bandgap structure (which will be called UC-PBG structure below) as one form of the inductive grid-type EBG structure. The UC-PBG structure is configured of two conductor layers, that is, a conductor layer which has a first conductor plane having no opening and a conductor layer having a periodical structure of a conductor pattern.

Patent Document 4 discloses therein an alternating impedance electromagnetic bandgap structure (which will be called AI-EBG structure below) as one form of the inductive grid type EBG structure. The AI-EBG structure is also configured of two conductor layers similar to the UC-PBG structure, that is, a conductor pattern layer having a periodical structure of the conductor pattern and a conductor plane layer having no opening. The conductor pattern layer is configured with an inductance element made of a large square conductor patch forming a periodical structure and a small square conductor patch connecting between adjacent large conductor patches as the layout shown in FIG. 1A in Patent Document 4. A small conductor patch and each large conductor patch, which function as an inductance element, are connected to an apex of the large conductor patch.

PRIOR ART DOCUMENTS

Patent Documents

[Patent Document 1]
U.S. Patent Application Laid-Open No. 2007 0176827
[Patent Document 2]
U.S. Patent Application Laid-Open No. 2007 0090398
[Patent Document 3]
U.S. Pat. No. 6,518,930
[Patent Document 4]
U.S. Pat. No. 7,215,301

DISCLOSURE OF THE INVENTION

However, since the structure disclosed in Patent Document 1 needs vias, its manufacture cost is higher as compared with the structure which needs no via. Since the resonance via-type EBG structure disclosed in Patent Document 2 needs at least three conductor layers and vias, its structure is more complicated and its manufacture cost is higher as compared with the EBG structure having the two conductor layers.

Since the inductive grid-type EBG structure disclosed in Patent Document 3 or Patent Document 4 neither has a large inductance value nor a large capacity value in the parallel resonance circuit of the equivalent circuit, there is a problem that a unit cell increases in size.

It is an object of the present invention to provide a structure including two conductor layers without vias and downsizing a size of a unit cell, an antenna, a communication device and an electronic component.

According to the present invention, there is provided a structure including: a first conductor; a second conductor opposite to the first conductor at least in part; a plurality of first openings provided in the first conductor; and a plurality of lines which are provided in the plurality of first openings and whose ends are connected to the first conductor, wherein unit cells each containing the first opening and the line are repeatedly arranged.

According to the present invention, there is provided a structure including: a first conductor; a second conductor opposite to the first conductor at least in part; a plurality of first openings provided in the first conductor; a plurality of island-shaped third conductors provided in the plurality of first openings to be separated from the first conductor, respectively; and chip inductors provided in the plurality of third conductors to connect the third conductors to the first conductor, wherein unit cells each having the first opening, the third conductor and the chip inductor are repeatedly arranged.

According to the present invention, there is provided an antenna including: an antenna element; and a reflective plate provided opposite to the antenna element, wherein the reflective plate has a structure including: a first conductor; a second conductor opposite to the first conductor at least in part; a plurality of first openings provided in the first conductor; and a plurality of lines which are provided in the plurality of first openings and whose ends are connected to the first conductor, respectively, wherein unit cells each containing the first opening and the line are repeatedly arranged.

According to the present invention, there is provided an electronic component including: a power supply layer to which power is supplied; a ground layer to which a ground is supplied; a first conductor provided in one of the power supply layer and the ground layer; a second conductor provided in the other of the power supply layer and the ground layer and opposite to the first conductor at least in part; a plurality of first openings provided in the first conductor; and a plurality of lines which are provided in the plurality of first openings and whose ends are connected to the first conductor, respectively, wherein unit cells each containing the first opening and the line are repeatedly arranged.

According to the present invention, it is possible to provide a structure capable configured by two conductor layers without vias and downsizing a size of unit cells, an antenna, a communication device and an electronic component.

BEST MODE FOR CARRYING OUT THE INVENTION

Figure 1:
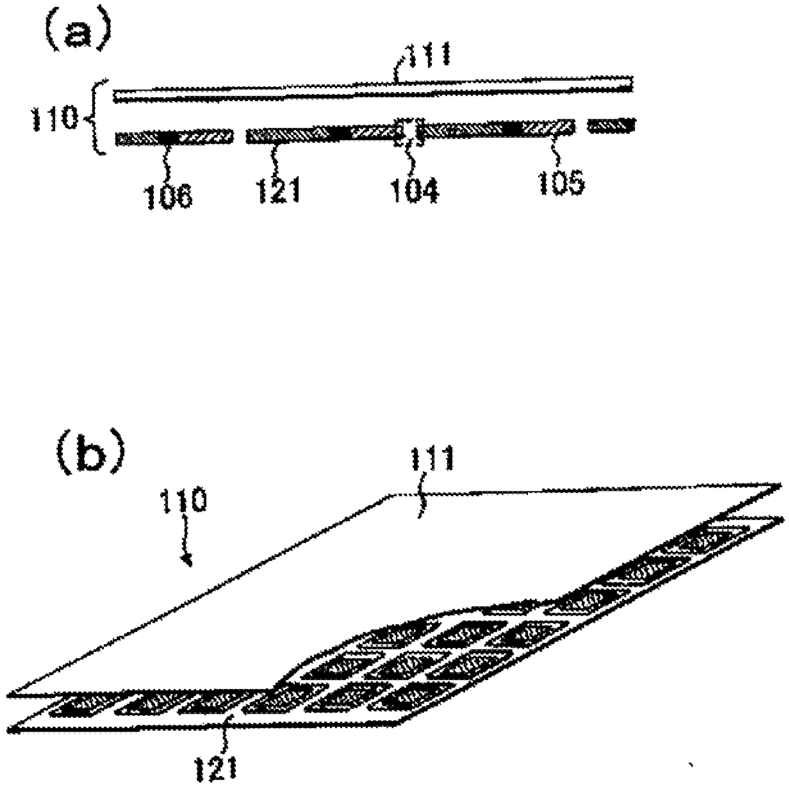
FIG. 1(*a*) is a cross-sectional view of a structure according to a first embodiment and FIG. 1(*b*) is a perspective view of the structure shown in FIG. 1(*a*).

Embodiments according to the present invention will be described below with reference to the drawings. Like reference numerals are denoted to like components throughout the drawings and will not be repeated as needed.

(First Embodiment)

Figure 2:
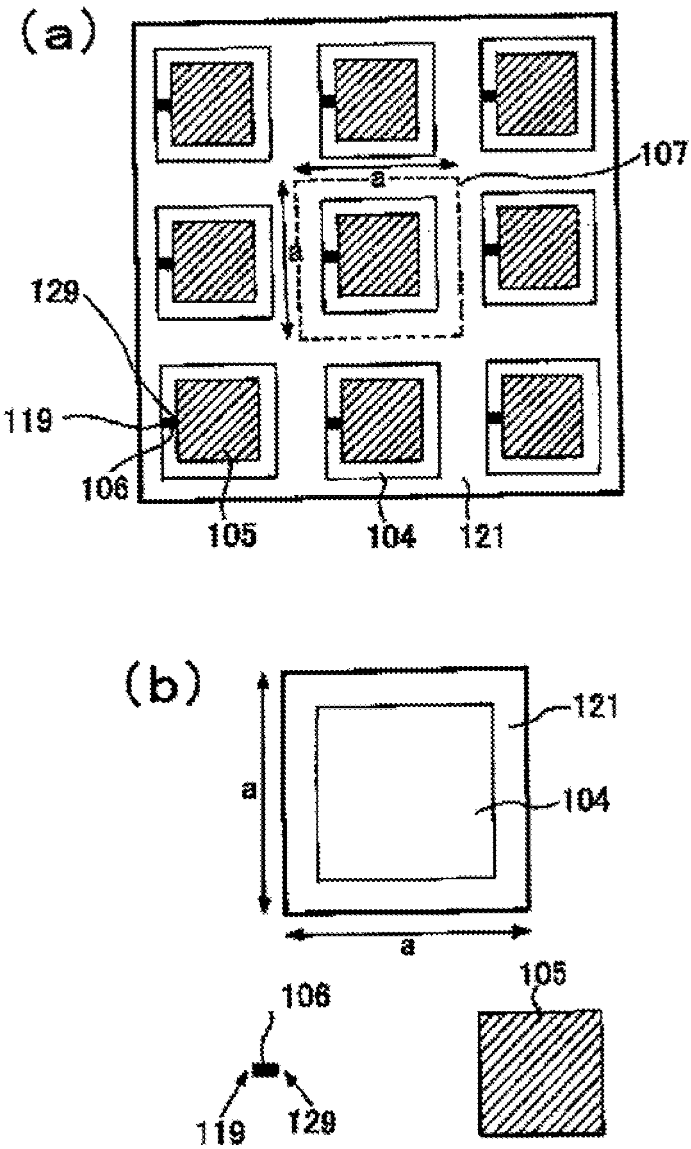
FIG. 2(*a*) is a plan view of a layer in which a first conductor pattern used for the structure shown in FIG. 1 is formed and FIG. 2(*b*) is a diagram in which respective components of the layer shown in FIG. 2(*a*) are exploded.

FIG. 1(*a*) is a cross-sectional view of a structure 110 according to a first embodiment, and FIG. 1(*b*) is a perspective view of the structure 110 shown in FIG. 1(*a*). FIG. 2(*a*) is a plan view of a layer in which a first conductor pattern 121 used for the structure 110 shown in FIGS. 1(*a*) and 1(*b*) is formed, and FIG. 2(*b*) is a diagram in which the respective components in the layer shown in FIG. 1(*a*) are exploded.

The structure 110 is configured of two conductor layers which are opposite to each other via a dielectric layer (such as dielectric plate), and includes a first conductor pattern 121 as first conductor, a second conductor pattern 111 as second conductor, a plurality of first openings 104 and a plurality of lines 106. The first conductor pattern 121 has a sheet shape, for example. The second conductor pattern 111 has a sheet shape, for example, and is opposite to the first conductor pattern 121 at least in part (or substantially in whole). A plurality of first openings 104 are provided in the first conductor pattern 121. The lines 106 are provided in the first openings 104, respectively, and one end of the line 106 is connected to the first conductor pattern 121. The unit cells 107 each containing the first opening 104 and the line 106 are repeatedly or periodically arranged. The cell units 107 are repeatedly arranged so that the structure 110 functions as a metamaterial such as EBG (Electromagnetic Band Gap).

The cell unit 107 in the structure 110 according to the present embodiment has a third conductor pattern 105 as a third conductor. The third conductor pattern 105 is an island-shaped pattern which is provided inside the first opening 104 to be separated from the first conductor pattern 121, and the other end 129 of the line 106 is connected thereto. The unit cell 107 is configured with the first opening 104, the line 106, the third conductor pattern 105, and an area in the second conductor pattern 111 which is opposite to the first opening 104, the line 106, and the third conductor pattern 105.

In the present embodiment, the unit cells 107 are arranged in two dimensions. More specifically, the unit cell 107 is arranged at a grid point of a square grid having a grid constant of a. Thus, the first openings 104 are identical to each other in a center-to-center distance. This is similar to the examples shown in FIGS. 4 (*a*) to 4(*c*), 5(*a*) and 5(*b*) described later. The unit cells 107 may be arranged in one dimension. The unit cells 107 have the same configuration and are arranged in the same orientation. In the present embodiment, the first opening 104 and the third conductor pattern 105 are both square, and are arranged in the same orientation such that their centers overlap one another. One end 119 of the line 106 is connected to the center of one side of the first opening 104 and linearly extends perpendicular to the one side thereof. The line 106 functions as an inductance element.

With the configuration, a capacity C occurs between the third conductor pattern 105 and the second conductor pattern 111. The line 106 (inductance L) as a plane type inductance element is electrically connected between the third conductor pattern 105 and the first conductor pattern 121. Thus, it is configured such that a series resonance circuit 118 is shunted between the second conductor pattern 111 and the first conductor pattern 121, and its circuit configuration is equivalent to the configuration shown in FIG. 3.

Since the structure 110 requires only two conductor layers and does not need vias, so that its configuration can be simplified and thinned and its manufacture cost can be reduced. Since the structure 110 employs the lines 106, the inductance can be remarkably increased as compared with the structure in which the inductance is formed by vias.

A frequency band of a stop band (band gap) is determined by a series resonance frequency based on the inductance and the capacity. When the series resonance frequency is desired to be set at a specific value, the lines 106 are provided so that the inductance is remarkably increased, thereby reducing the capacity. Therefore, the third conductor pattern 105 can be downsized and consequently the length a of the opening 104 and the unit cell 107 can be shortened, thereby downsizing the structure 110.

In the structure 110 according to the present embodiment, a DC current passes through the first conductor pattern 121 not the line 106. The DC current does not pass through the line 106 because the third conductor pattern 105 leading to the line 106 is open. In other words, when the first opening 104 is made smaller, the first conductor pattern 121 through which the DC current passes can be widened, thereby reducing a resistance against the DC current.

Figure 4:
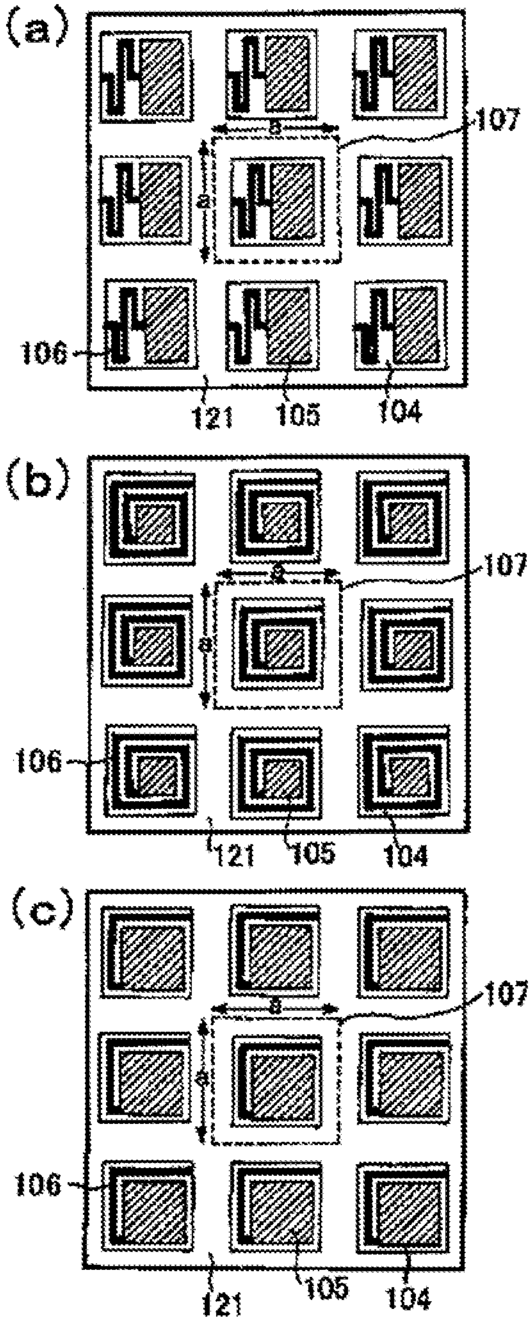
FIGS. 4(*a*) to 4 (*c*) are diagrams showing a modification of the lines.

The line 106 is linear in the example of FIG. 2, but the line 106 may be a meander shape as shown in FIG. 4(*a*) or a spiral shape as shown in FIG. 4(*b*). Further, the line 106 may be a polygonal line shape as shown in FIG. 4(*c*).

FIG. 2 shows an example in which one third conductor pattern 105 and one line 106 are formed in each first opening 104, but more than one third conductor pattern 105 and more than one line 106 may be formed in each first opening 104. The example shown in FIG. 5(*a*) is a plan view showing a layout of the first conductor pattern 121 in which two third conductor patterns 105 and two lines 106 are formed in the first opening 104. In the figure, the two sets of third conductor patterns 105 and lines 106 are arranged in the first opening 104 to be line-symmetric. The first opening 104 is square and the two third conductor patterns 105 are each rectangular. The first opening 104 and the third conductor pattern 105 are parallel to each other. The two third conductor patterns 105 are arranged to be line-symmetric to each other around the line connecting between the center of the first opening 104 and the center of one side of the first opening 104. One end 119 of the line 106 linearly extends perpendicular to one side of the first opening 104 from the center of the side thereof, and the other end 129 is connected to the center of a long side of the third conductor pattern 105.

Figure 5:
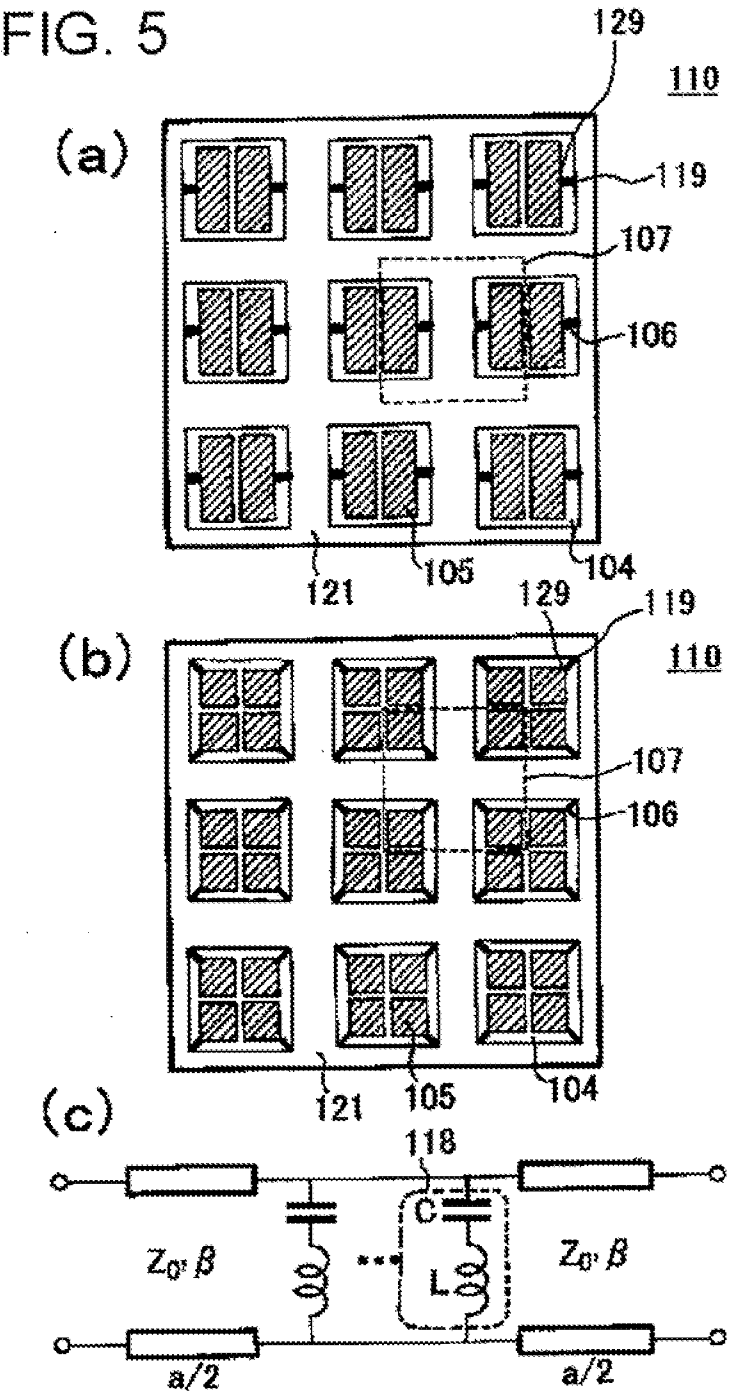
FIGS. 5(*a*) to 5(*c*) are diagrams showing a modification of an arrangement of third conductor patterns and lines.

The example shown in FIG. 5(*b*) is a plan view showing a layout of the first conductor pattern 121 in which four third conductor patterns 105 and four lines 106 are formed in the first opening 104. In the figure, the four sets of third conductor patterns 105 and lines 106 are arranged in the first opening 104 a 90° intervals to be point symmetric around the center of the first opening 104. The first opening 104 is square and the four third conductor patterns 105 are each square. The first opening 104 and the third conductor pattern 105 are parallel to each other. The four third conductor patterns 105 are arranged to be point symmetric around the center of the first opening 104. One end 119 of the line 106 linearly extends at 45° relative to one side of the first opening 104 from a corner of the first opening 104 and the other end 129 is connected to one corner of the third conductor pattern 105.

In the structure 110 shown in FIGS. 5(*a*) and 5(*b*), the equivalent circuit per unit cell 107 is configured as shown in FIG. 5(*c*) such that a plurality of series resonance circuits 118 are connected in parallel.

Figure 3:
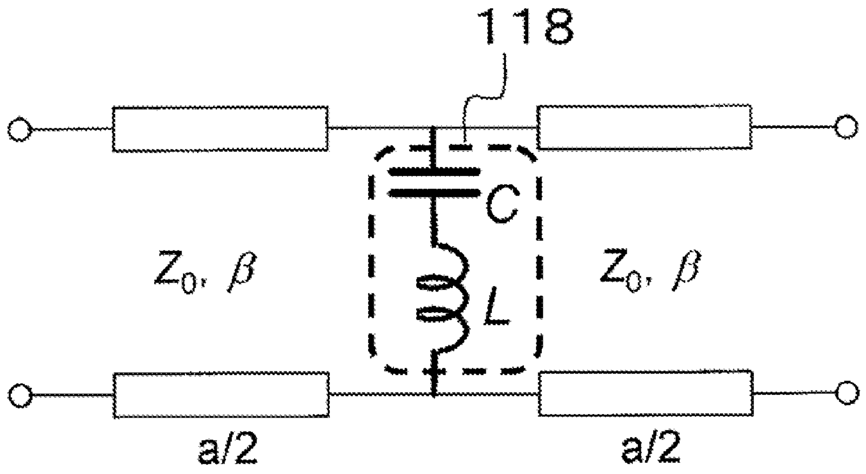
FIG. 3 is an equivalent circuit diagram of the structure shown in FIG. 1.

When the series resonance circuits 118 are equal to each other, the circuits are equivalent to the circuit shown in FIG. 3 and thus the same characteristics can be obtained as when one third conductor pattern 105 and one line 106 are formed in each first opening 104. On the other hand, when the series resonance circuits 118 connected in parallel are different from each other, the stop band can be widened or made to be multiband.

FIG. 2(*a*) shows an example in which the square first openings 104 are periodically arranged in a square grid shape, but the layout of the first openings 104 is not limited to square in FIG. 2(*a*). For example, the regular-hexagonal first opening 104 may be polygonal such as regular hexagonal or circular. The first openings 104 may be arranged in a triangle grid shape.

One example of a method of manufacturing the structure 110 will be described below. At first, conductive films are formed on both sides of a sheet-shaped dielectric layer. A mask pattern is formed on one conductive film and the conductive film is etched with the mask pattern as a mask. Thus, the conductive film is selectively removed so that the first conductor pattern 121, the first openings 104 and the lines 106 are integrally formed. The other conductive film can be used as the second conductor pattern 111 as it is.

The structure 110 can be manufactured by using the first conductor pattern 121, a dielectric film such as silicon oxide film, and the second conductor pattern 111 for a thin film process and sequentially forming the same on a glass substrate or a silicon substrate. Alternatively, nothing may be provided (or air may be provided) in a space in which the second conductor pattern 111 and the first conductor pattern 121 are opposite to each other.

(Second Embodiment)

Figure 6:
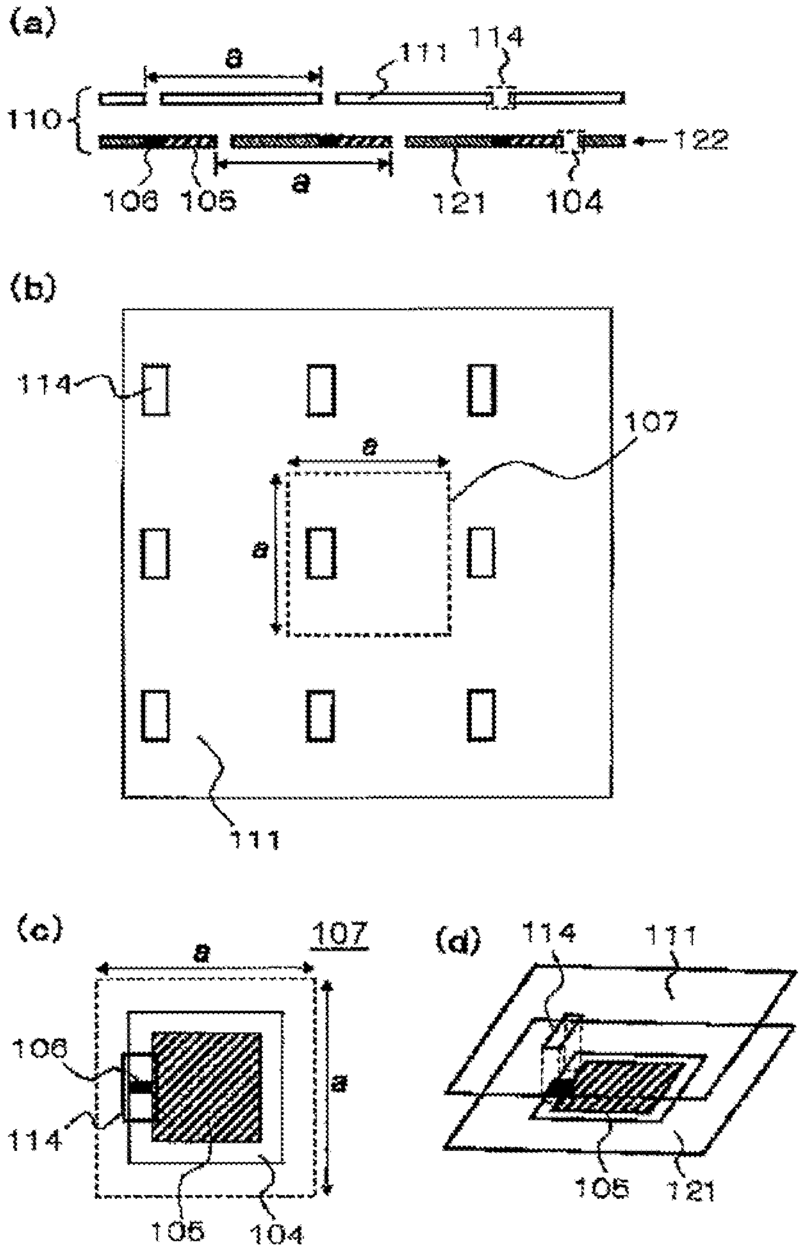
FIG. 6(*a*) is a cross-sectional view of a structure according to a second embodiment, FIG. 6(*b*) is a plan view of a second conductor pattern of the structure shown in FIG. 6(*a*), FIG. 6(*c*) is a transparent plan view when viewing a unit cell in the structure shown in FIG. 6(*a*) from the top, and FIG. 6(*d*) is a perspective view of the unit cell.

FIG. 6(*a*) is a cross-sectional view of a structure 110 according to a second embodiment. The structure 110 according to the present embodiment is similar to the structure 110 according to the first embodiment in configuration except that the second openings 114 are provided in the second conductor pattern 111. The second openings 114 overlap the lines 106 in a plan view, respectively. The second openings 114 are provided so that magnetic fluxes interlinking between the line 106 and the second conductor pattern 111 increase, and thus the inductance per unit length of the line 106 increases.

FIG. 6(*b*) is a plan view of the second conductor pattern 111 in the structure 110 shown in FIG. 6(*a*). The second openings 114 are periodically arranged in the second conductor pattern 111. The period of the second opening 114 is a, and is equal to the length of one side of the unit cell 107 and the period of the first opening 104.

FIG. 6(*c*) is a transparent plan view of the unit cell 107 of the structure 110 shown in FIG. 6(*a*) viewed from its top, and FIG. 6(*d*) is a perspective view of the unit cell 107. In the figures, the lines 106 are all positioned in the second openings 114 in a plan view, respectively. Therefore, the inductance per unit length of the line 106 can be increased. Thus, since the line 106 can be downsized to be designed at a desired inductance value, the area occupied by the line 106 can be reduced and consequently the unit cell 107 can be downsized.

Figure 7:
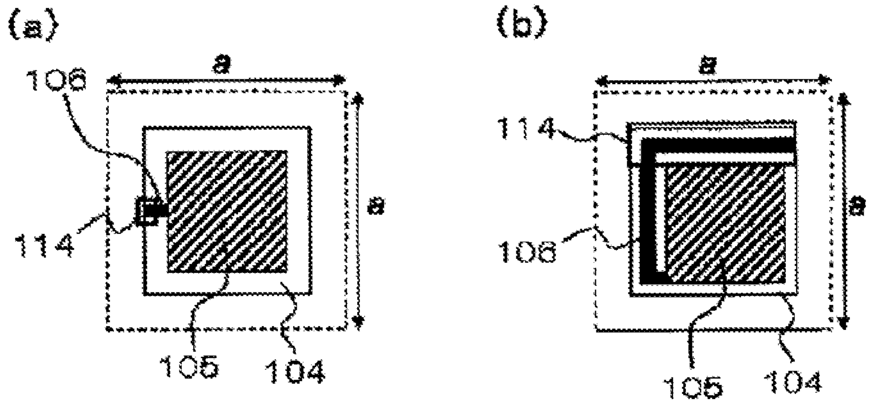
FIGS. 7(*a*) and 7(*b*) are plan views showing an example in which part of the line is contained in a second opening when viewing the unit cell from the top.

FIG. 6(*c*) shows an example in which the entire line 106 is contained in the second opening 114 when the unit cell 107 is viewed from its top, but part of the line 106 may be designed to be positioned in the second opening 114 in a plan view. FIG. 7(*a*) and (*b*) are a plan view showing an example in which part of the line 106 is contained in the second opening 114 when the unit cell 107 is viewed from its top. The configuration is effective for enabling both the downsizing of the second opening 114 and the increase in the inductance.

Figure 8:
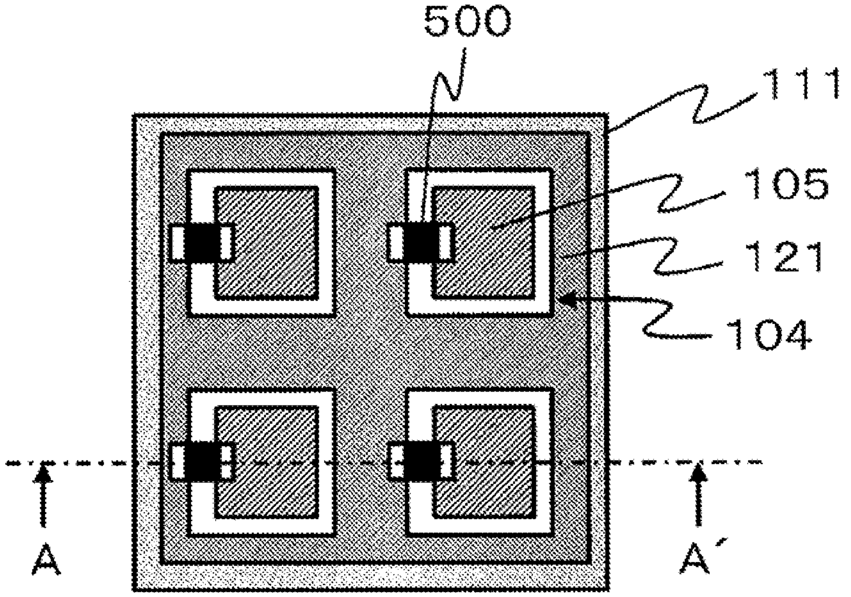
FIG. 8 a diagram showing an example using a chip inductor instead of the line.
Figure 8:
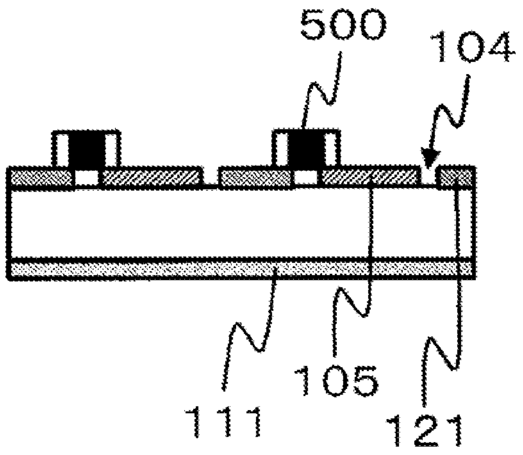

In the respective examples shown in the first and second embodiments, a chip inductor 500 may be used instead of the line 106 as shown in a plan view of FIG. 8(*a*) and a cross-sectional view of FIG. 8(*b*).

(Third Embodiment)

Figure 9:
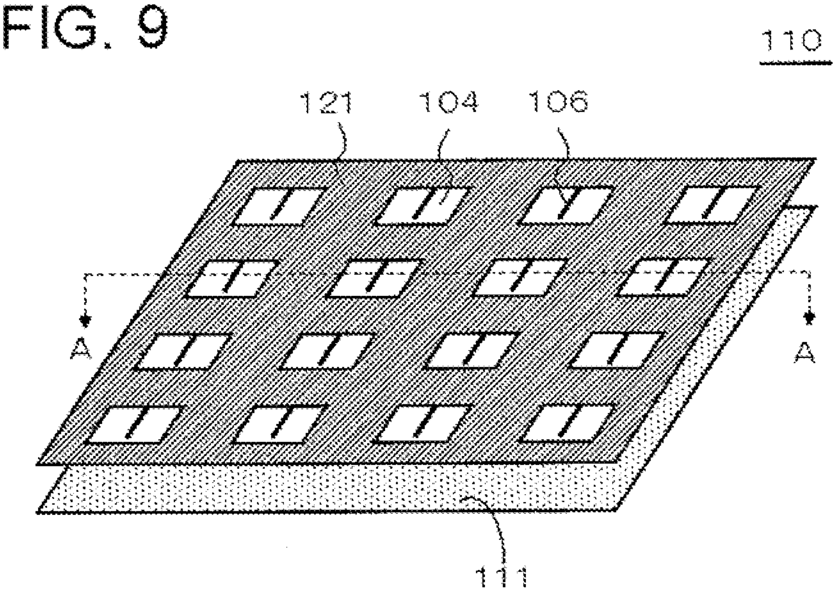
FIG. 9 is a perspective view of a structure according to a third embodiment.
Figure 10:
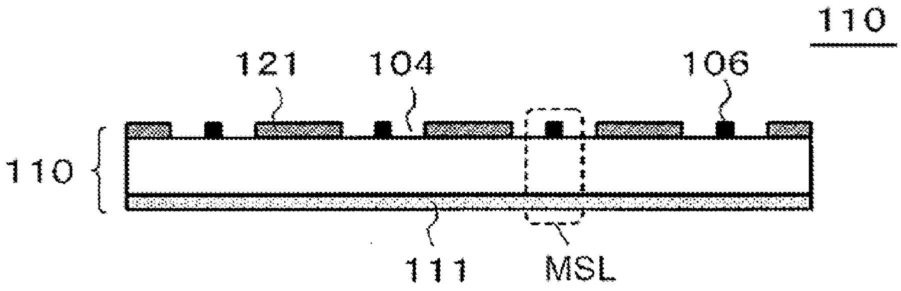
FIG. 10(*a*) is a cross-sectional view of the structure shown in FIG. 9 and FIG. 10(*b*) is a plan view of a layer in which the first conductor pattern is provided.
Figure 10:
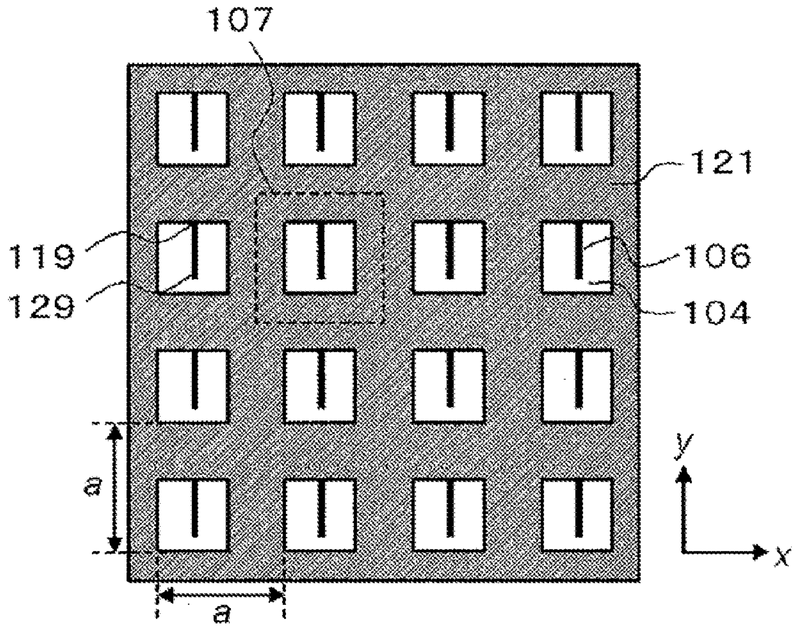

FIG. 9 is a perspective view of a structure 110 according to a third embodiment. FIG. 10(*a*) is a cross-sectional view of the structure 110 shown in FIG. 9, and FIG. 10(*b*) is a plan view of a layer in which the first conductor pattern 121 is provided. The structure 110 is the same as the structure 110 according to the first embodiment except that the third conductor pattern 105 is not provided and the end 129 of the line 106 is an open end. In the present embodiment, the line 106 functions as an open stub, and a part opposite to the line 106 in the second conductor pattern 111 and the line 106 form a transmission line 101 such as microstrip line. A method of manufacturing the structure 110 according to the present embodiment is the same as that according to the first embodiment.

In the example shown in the figure(s), there is configured that a unit cell 107 includes the first opening 104 and the line 106 as well as an area opposite to them in the second conductor pattern 111. In the examples shown in FIGS. 9 and 10, the unit cells 107 are arranged in two dimensions in a plan view. More specifically, the unit cell 107 is respectively arranged at a grid point of a square grid having a grid constant of a. Thus, the first openings 104 are arranged to be identical to each other in a center-to-center distance.

The unit cells 107 have the same configuration each other and are arranged in the same orientation. In the present embodiment, the first opening 104 is square. The line 106 linearly extends perpendicular to one side of the first opening 104 from the center of the side thereof.

Figure 11:
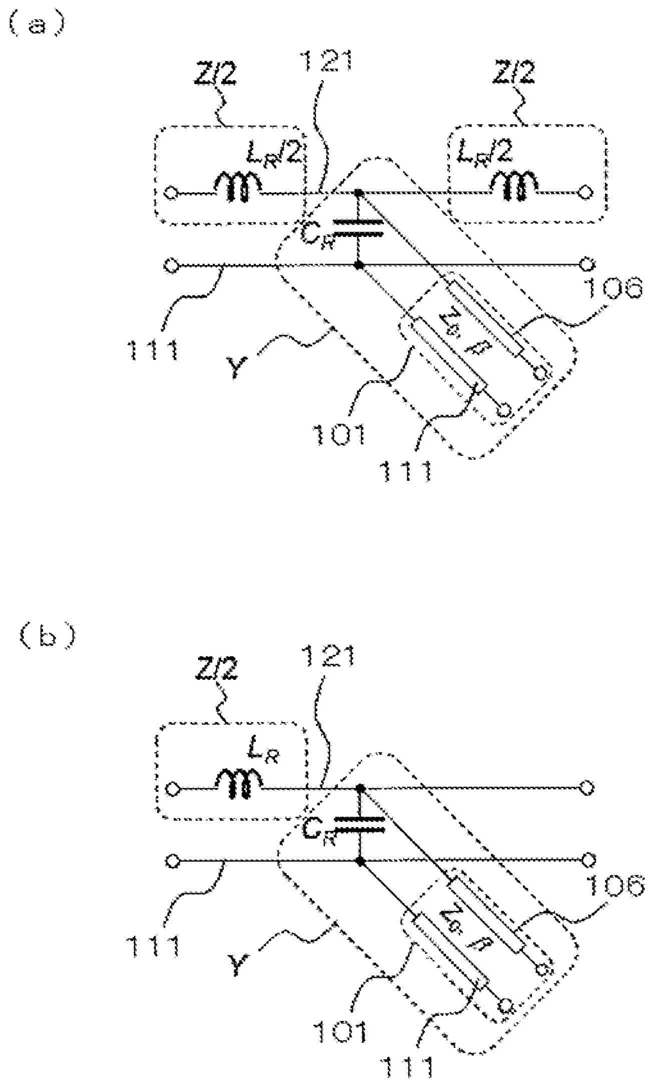
FIG. 11(*a*) is an equivalent circuit diagram of the unit cell shown in FIG. 10 and FIG. 11(*b*) is an equivalent circuit diagram of the unit cell when the unit cell shown in FIG. 10 is shifted by half period of a 2 in the x direction in FIG. 10.

FIG. 11(*a*) is an equivalent circuit diagram such as a unit cell 107 shown in FIG. 10. As shown in the figure, a parasitic capacity CR is formed between the first conductor pattern 121 and the second conductor pattern 111. An inductance LR is formed in the first conductor pattern 121. In the example shown in the figure, since the first conductor pattern 121 is divided into two halves by the first openings 104 in the unit cell 107 and the line 106 is arranged at the center of the first opening 106, the inductance LR is also divided into two halves with respect to the line 106.

As described above, the line 106 functions as an open stub, and a part opposite to the line 106 in the second conductor pattern 111 and the line 106 forma transmission line 101 such as microstrip line. The other end of the transmission line 101 is an open end.

FIG. 11(*b*) is an equivalent circuit diagram of the unit cell 107 when the unit cell 107 shown in FIG. 10 is shifted by a half period of a 2 in the x direction in FIG. 10. In the examples shown in the figure, the unit cell 107 is taken differently, and thus the inductance LR is not divided by the lines 106. Since the unit cells 107 are periodically arranged, the characteristics of the structure 110 shown in FIG. 9 does not change due to how the unit cell 107 is taken differently.

The characteristics of the electromagnetic wave propagating in the structure 110 are determined by a series impedance Z based on the inductance LR and an admittance based on the transmission line 101 and the parasitic capacity CR.

Figure 12:
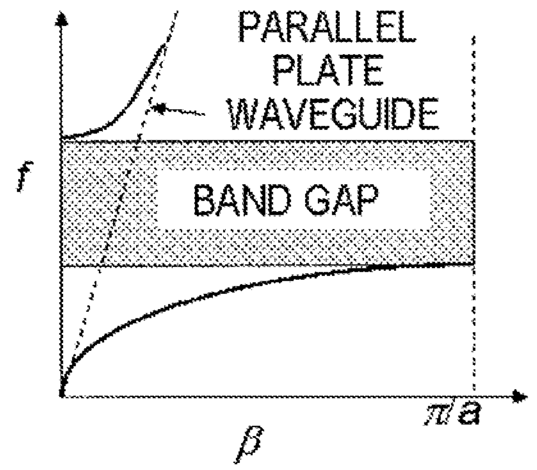
FIG. 12 is a diagram showing a dispersion curve when the structure shown in FIG. 9 and a parallel plate waveguide are compared in electromagnetic wave propagation characteristics.

FIG. 12 shows dispersion curves when the structure 110 shown in FIG. 9 and a parallel plate waveguide are compared in electromagnetic wave propagation characteristics. In FIG. 12, the solid line indicates a dispersion relationship when an infinite number of unit cells 107 are periodically arranged in the structure 110 shown in FIG. 9. The broken line indicates a dispersion relationship in the parallel plate waveguide which is formed by replacing the first conductor pattern 121 in FIG. 9 with a conductor pattern having no first opening 104 and no line 106.

In the case of the parallel plate waveguide indicated by the broken line, a wavenumber and a frequency are in a proportional relationship so that they are indicated by a straight line, and the tilt is expressed by the following equation (1).

$$f\beta = c/(2\pi\cdot(\epsilon r\cdot\mu r)1/2 \qquad (1)$$

On the other hand, in the case of the structure 110 shown in FIG. 9, as the frequency increases, the wavenumber rapidly increases as compared with the parallel plate waveguide indicated by the broken line, and when the wavenumber reaches 2π/a, the band gap appears in the frequency band of 2π/a or more. As the frequency further increases, a pass band appears again. A phase speed for the pass band appearing at the lowest frequency side is smaller than a phase speed for the parallel plate waveguide indicated by the dotted line.

In the equivalent circuit diagrams of the unit cell 107 shown in FIGS. 11(*a*) and 11(*b*), as the line length of the transmission line 101 is elongated, the band gap is shifted to the low frequency side. Typically, when the unit cell size is reduced, the band gap is shifted to the high frequency side, but as the line length of the transmission line 101 is elongated, the unit cell size can be reduced without changing the lower-limit frequency of the band gap.

As the line length of the transmission line 101 is elongated, the band gap is shifted to the low frequency side and the phase speed in the pass band appearing at the lowest frequency side is also reduced. For the pass band appearing in the lowest frequency side, at the same frequency, a condition, that the wavenumber of the electromagnetic wave in the structure 110 shown in FIG. 9 is larger than the wavenumber of the electromagnetic wave in the parallel plate waveguide, is met. Thus, the wavelength of the electromagnetic wave in the structure 110 shown in FIG. 9 is shorter than the wavelength of the electromagnetic wave in the parallel plate waveguide. In other words, the structure 110 shown in FIG. 9 is used so that the resonator can be reduced in size.

The admittance Y is determined by an input admittance of the transmission line 101 and a capacity CL. The input admittance of the transmission line 101 is determined by a line length of the transmission line 101 (that is, a length of the line 106) and an effective dielectric constant of the transmission line 101. The input admittance of the transmission line 101 at a certain frequency is capacitive or inductive depending on the line length and the effective dielectric constant of the transmission line 101. Generally, the effective dielectric constant of the transmission line 101 is determined by a dielectric material making the waveguide. To the contrary, the line length of the transmission line 101 has a degree of freedom, and the line length of the transmission line 101 can be designed such that the admittance Y is inductive in a desired band. In this case, the structure 110 shown in FIG. 9 behaves as having a band gap in the desired band.

Thus, in order to realize the structure described in the equivalent circuit shown in FIG. 11(*a*) or 11(*b*), it is required that the line lengths of the lines 106 in the respective first openings 104 are equal to each other, the connection parts between the ends 119 of the lines 106 and the first conductor pattern 121 are periodically arranged, and the ends 119 are at the same positions in the respective unit cells 107.

Figure 13:
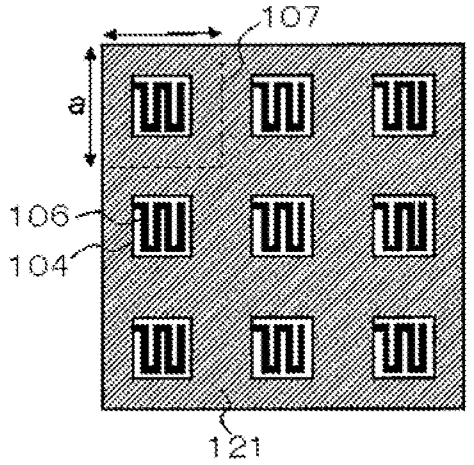
FIG. 13 is a diagram showing an example in which an line extends to form a meander.
Figure 14:
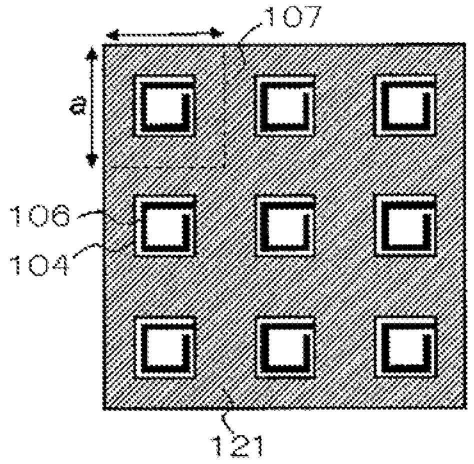
FIG. 14 is a diagram showing an example in which an line extends to form a loop.
Figure 15:
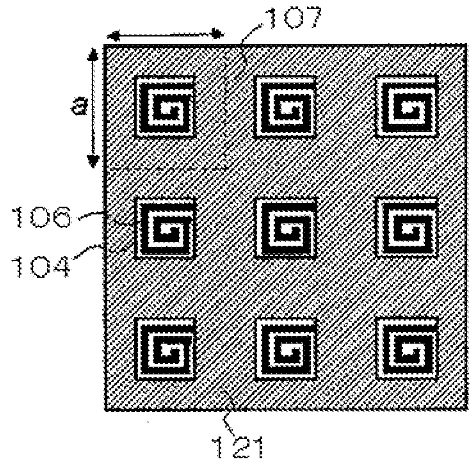
FIG. 15 is a diagram showing an example in which an line extends to form a spiral.

The line length of the transmission line 101, that is, the length of the line 106 can be adjusted by changing the elongated shape of the line 106 as needed. For example, in the example shown in FIG. 13, the line 106 extends to form a meander. In the example shown in FIG. 14, the line 106 extends to form a loop along the edge of the first opening 104. In the example shown in FIG. 15, the line 106 extends to form a spiral.

Figure 16:
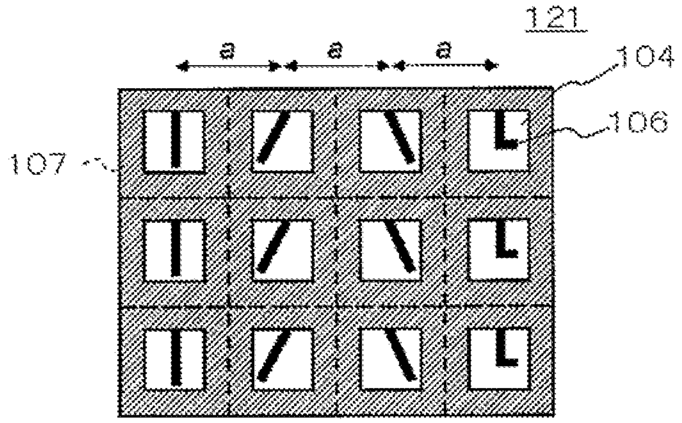
FIG. 16 is a diagram showing an example in which the shapes of the lines are different from each other.

As shown in FIGS. 9, 10, and 13 to 15, if there is provided a periodical arrangement having the unit configuration in which the shapes, sizes and orientations of the lines 106 in the first opening 104 are all the same, respectively, it is easy to design. As shown in a modification of FIG. 16, at least one of the lines 106 may be different from the remaining lines. In FIG. 16, the lines 106 are different from each other in shape, and one of them is a polygonal line shape. The lengths of the lines 106 are equal to each other. The position of one end 119 in the line 106 is the same in each unit cell 107 and thus the position of the end 119 maintains periodicity.

Figure 17:
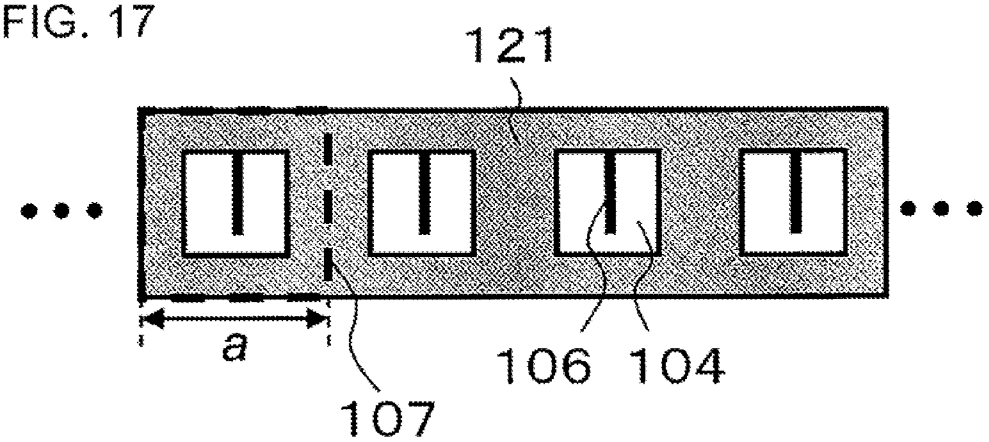
FIG. 17 is a diagram showing an example in which the unit cells are arranged in one dimension.

As shown in a modification of FIG. 17, the unit cells 107 may be arranged in one dimension. Also in this case, the respective unit cells 107 are arranged in the same orientation.

Figure 18:
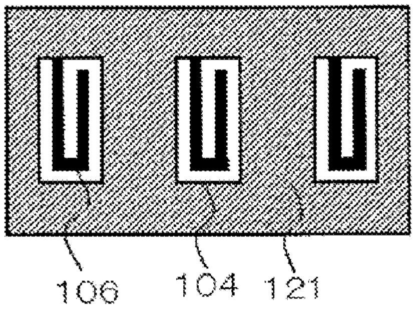
FIG. 18 is a diagram showing an example in which a first opening is rectangular.
Figure 19:
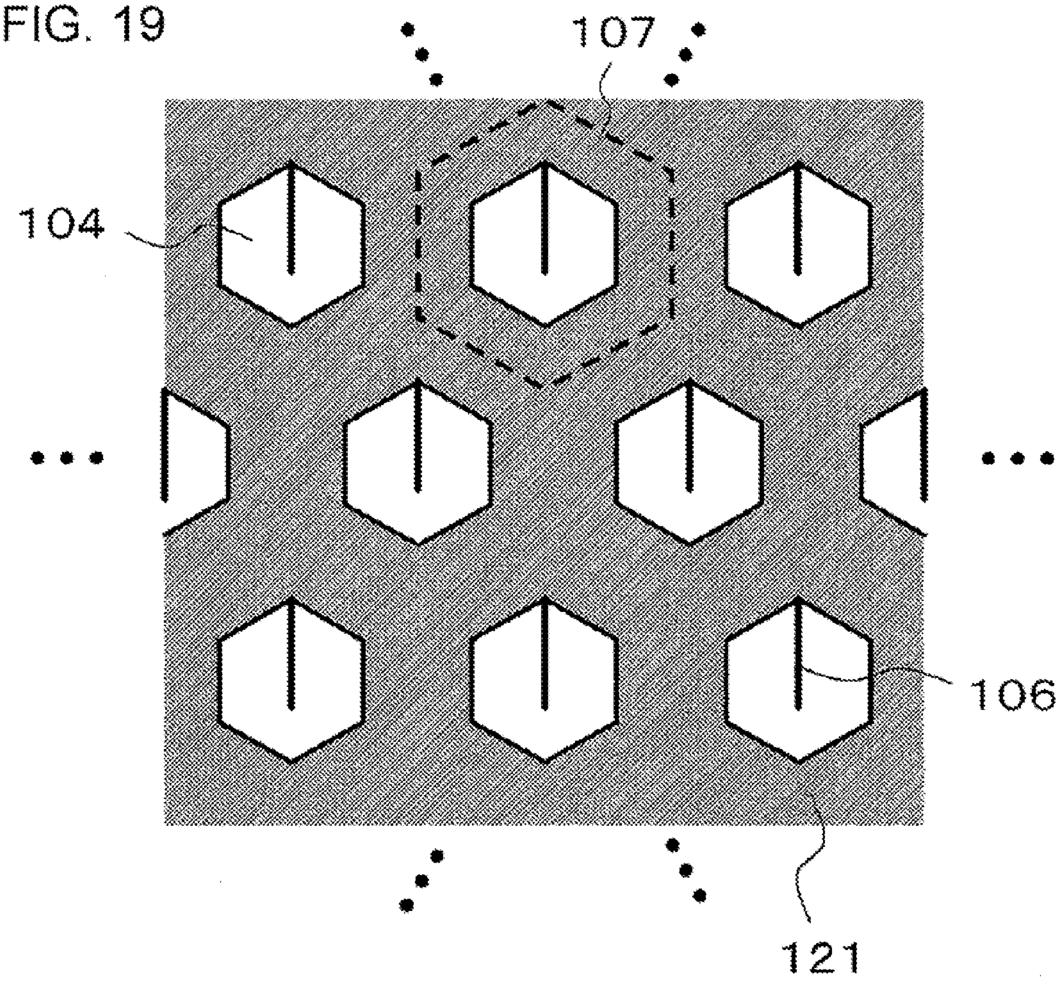
FIG. 19 is a diagram showing an example in which the first opening is regular hexagonal.

The first opening 104 does not need to be square and may be other polygonal. For example, the first opening 104 may be rectangular as shown in FIG. 18 or may be regular hexagonal as shown in FIG. 19. In the example shown in FIG. 19, the line 106 extends at 60 degrees with respect to one side of the first opening 104 from a corner of the first opening 104.

Figure 20:
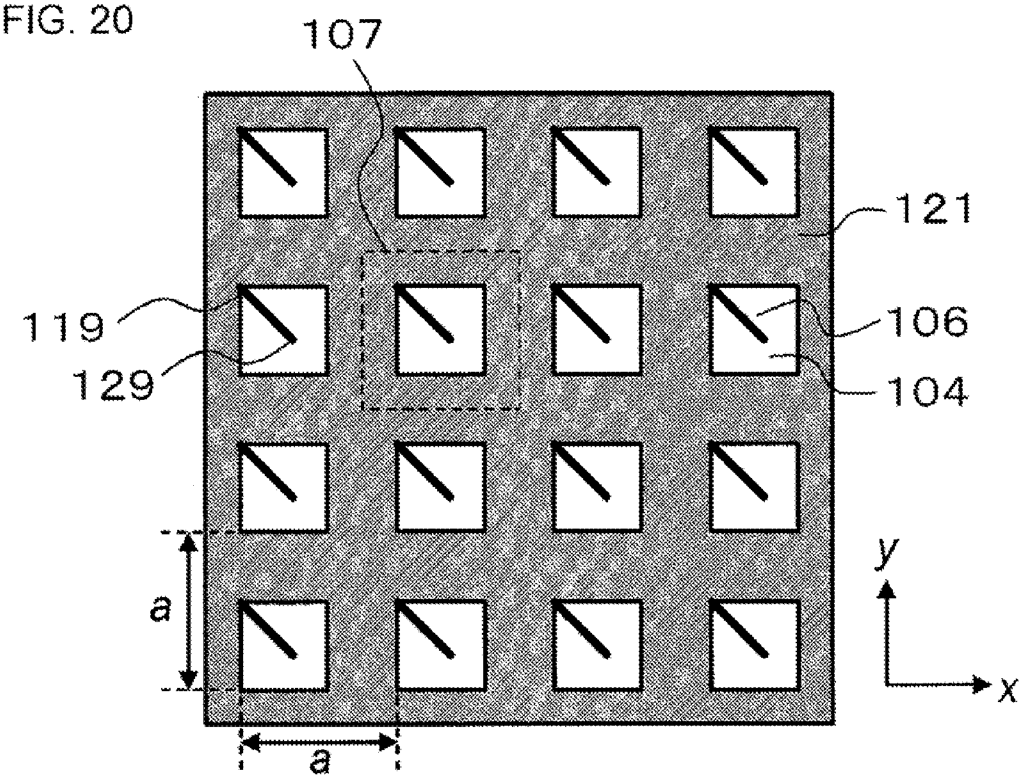
FIG. 20 is a diagram showing an example in which one end of the line is connected to a corner of the square first opening.

As shown in FIG. 20, one end 119 of the line 106 may be connected to a corner of the square first opening 104. In the example shown in the figure, the line 106 extends at 45 degrees with respect to a side of the first opening 104 from a corner of the first opening 104.

Figure 21:
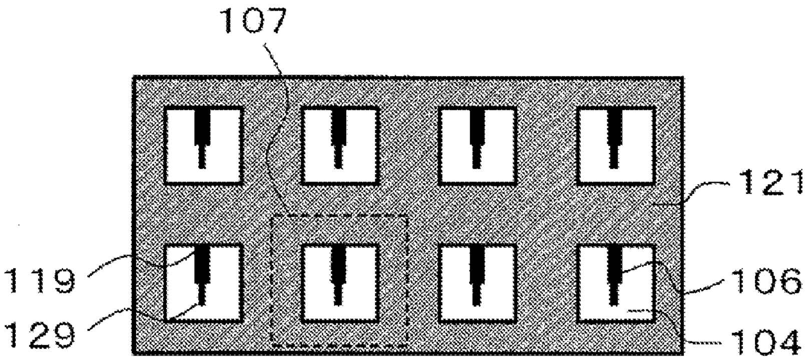
FIG. 21 is a diagram showing an example in which a width of the line changes in the middle.
Figure 21:
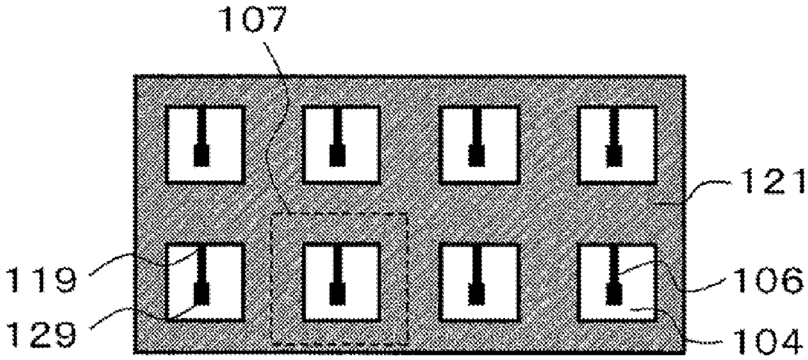

As shown in FIG. 21, the line 106 may change in its width in the middle. For example, in the example shown in FIG. 21(*a*), one end 119 of the line 106 connected to the first conductor pattern 121 is wider than the other end 129 as an open end. In the example shown in FIG. 21(*b*), one end 119 is narrower than the other end 129.

Figure 22:
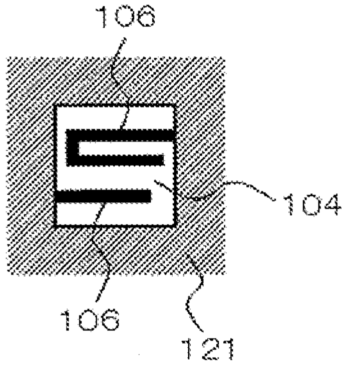
FIG. 22(*a*) is a diagram showing an example in which a plurality of lines are provided in the first opening and FIG. 22 (*b*) is a diagram showing an example in which a branch line branched from the line is provided in the first opening.
Figure 22:
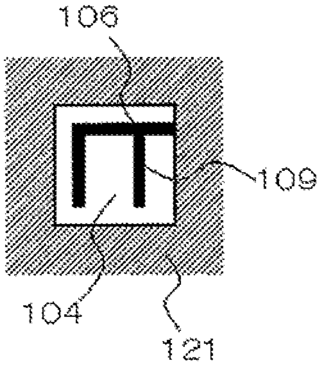

As shown in FIG. 22(*a*), a plurality of lines 106 may be arranged in the first opening 104. In this case, the lines 106 positioned in the same first opening 104 are preferably different from each other in length. As shown in FIG. 22(*b*), a Branch line 109 which is branched from the line 106, may be provided in the first opening 104. In this case, a length from one end of the line 106 to the open end of the Branch line 109 is preferably different from a length of the line 106. In either case of the FIGS. 22(*a*) and 22(*b*), the unit cells 107 preferably have the same configuration and the same orientation.

In each example described above, the shapes of the first openings 104 may be different from each other. The position of the end 119 of the line 106 needs to have a periodicity.

As described above, according to the present embodiment, it is possible to provide the structure 110 capable configured by two conductor layers without vias and capable of downsizing a unit cell 107.

As shown in FIG. 22, when the lines 106 having a different length are provided in the first opening 104 or the branch line 109 is provided therein, an equivalent circuit of the unit cell 107 has a plurality of transmission paths having a different length in parallel. Thus, the structure 110 has a band gap in a frequency band corresponding to the length of each transmission path and thus can have a plurality of band gaps (to be multiband).

(Fourth Embodiment)

Figure 23:
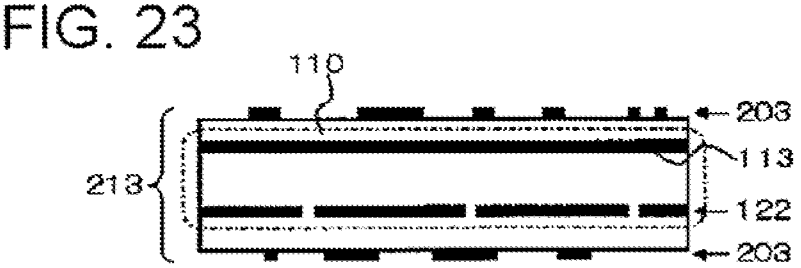
FIG. 23 is a cross-sectional view of an electronic component according to a fourth embodiment.

FIG. 23 is a cross-sectional view of an electronic component according to a fourth embodiment. The electronic component according to the present embodiment is a circuit board 213, and includes a power supply layer 113 on which a power supply plane is formed, and a ground layer 122 on which a ground plane is formed. The power supply layer 113 and the ground layer 122 are used so that the structure 110 shown in any of the first to third embodiments is configured. Specifically, the first conductor pattern 121, a plurality of first openings 104 and a plurality of lines 106 as well as the third conductor patterns 105 as needed are formed on one of the power supply layer 113 and the ground layer 122. The second conductor pattern 111 is formed on the other of the power supply layer 113 and the ground layer 122. In the present embodiment, the structure 110 is provided, as a noise filter, in a partial area of the circuit board 213 in a plan view. Thus, a noise can be prevented from propagating inside the circuit board 213. A detailed description will be made below.

In the example shown in FIG. 23, the circuit board 213 is configured of four conductor layers. The structure 110 as a noise filter is formed of two internal conductor layers formed in the circuit board 213. The second conductor pattern 111 and the first conductor pattern 121 configure the structure 110, and signal layers 203 are formed on the upper side of the second conductor pattern 111 and on the lower side of the first conductor pattern 121, respectively. One of the first conductor pattern 121 and the second conductor pattern 111 is connected to the power supply plane and the other is connected to the ground plane.

In the example shown in FIG. 23, the second conductor pattern 111 of the structure 110 is formed on the upper layer side and the first conductor pattern 121 is formed on the lower layer side but the second conductor pattern 111 may be formed on the lower layer side and the first conductor pattern 121 maybe formed on the upper layer side. The signal layers 203 are arranged on the first conductor pattern 121 and the second conductor pattern 111 but may be provided only on either one of the first conductor pattern 121 or the second conductor pattern 111.

Figure 24:
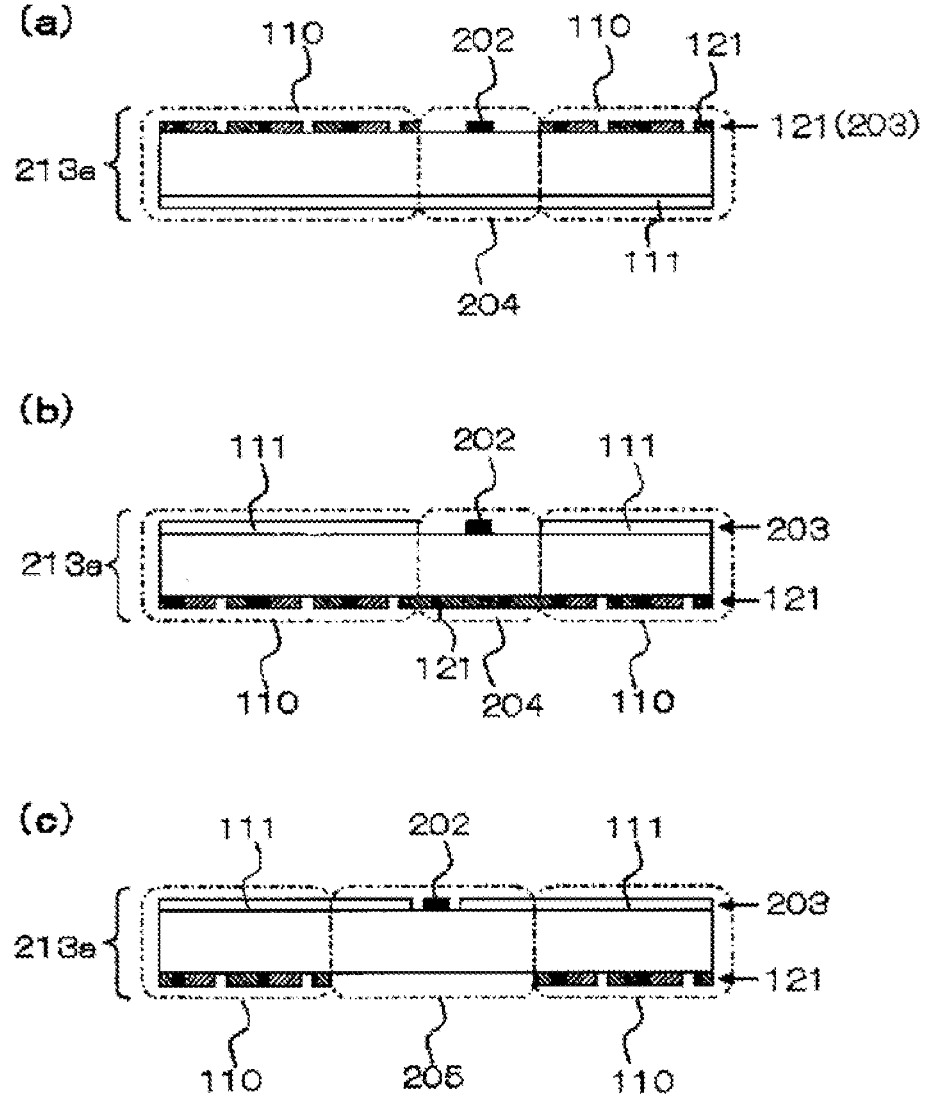
FIG. 24 is a diagram showing a case in which a circuit board is configured of two conductor layers.

As shown in each of FIGS. 24(*a*) to 24(*c*), even when the circuit board 213 is configured of two conductor layers, the structure 110 as a noise filter may be incorporated in the circuit board 213. In this case, the signal layer 203 is formed on either one of the power supply layer or the ground layer (the power supply layer, for example). As shown in the cross-sectional views of FIGS. 24(*a*) and 24(*c*), there may be configured such that the second conductor pattern 111 or the first conductor pattern 121 is contained in the signal layer 203.

In FIG. 24(*a*), the second conductor pattern 111 is formed on the lower layer side and the first conductor pattern 121 is formed on the upper layer side. In the figure, the structures 110 are provided in the right and left sides, and a microstrip line 204 configured with a Signal line 202 and the second conductor pattern 111 is provided therebetween. In the example shown in FIG. 24(*a*), the Signal line 202 is provided in the same layer as the first conductor pattern 121 and thus the first conductor pattern 121 is contained in the signal layer 203.

In FIG. 24(*b*), the second conductor pattern 111 is formed on the upper layer side and the second conductor plane 122 layer is formed on the lower layer side. The structures 110 are provided in the right and left sides, and the microstrip line 204 configured with the Signal line 202 and the first conductor pattern 121 is provided therebetween. The Signal line 202 is provided in the layer of the second conductor pattern 111 in this manner and thus the second conductor pattern 111 is contained in the signal layer 203.

Further, a transmission line configuration other than the microstrip line may be employed. In the example shown in FIG. 24 (*c*), the structures 110 are provided in the right and left sides, and a coplanar waveguide 205 configured with the Signal line 202 and the second conductor pattern 111 is provided therebetween. In the example shown in FIG. 24 (*c*), the Signal line 202 is provided in the layer of the second conductor pattern 111 and thus the second conductor pattern 111 is contained in the signal layer 203.

Figure 25:
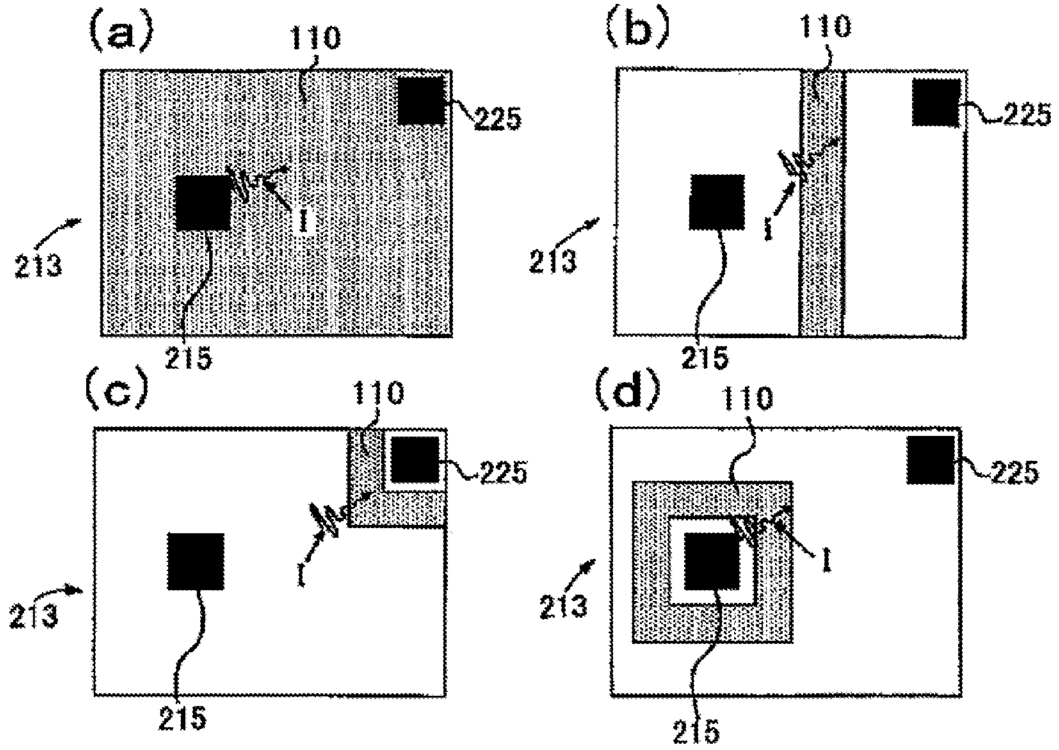
FIG. 25 is a plan view showing arrangement examples on the circuit board of the structure, respectively.
Figure 26:
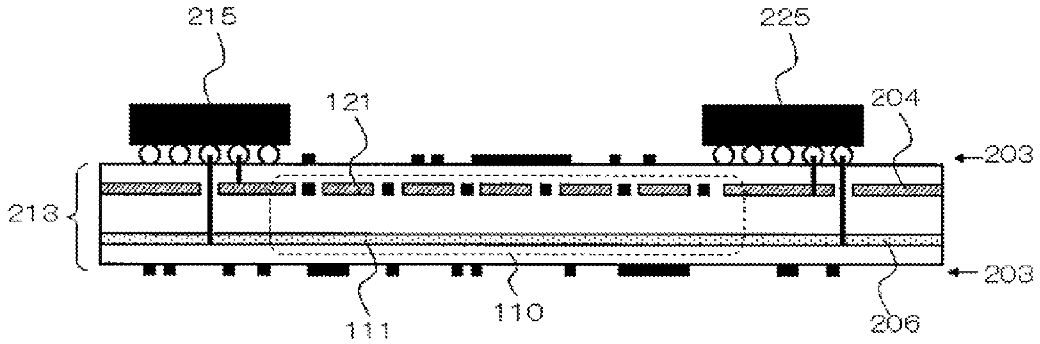
FIG. 26 is a cross-sectional view of the circuit board shown in FIG. 25.

FIG. 25 is a plan view showing examples in which the structure 110 is arranged on the circuit board 213, and FIG. 26 is a cross-sectional view of FIG. 25. A semiconductor package 215 as noise source is mounted on a first area and a noise-sensitive semiconductor package 225 is mounted on a second area on the circuit board 213, respectively, and the respective semiconductor packages are electrically connected to the power supply plane 204 in the power supply layer and the ground plane 206 in the ground layer through vias, respectively, as shown in FIG. 26.

In the example of FIG. 25(*a*), the structure 110 as a power supply noise suppression filter is arranged in the entire area between the power supply layer and the ground layer in the circuit board 213. As described above, either one of the first conductor pattern 121 or the second conductor pattern 111 configuring the structure 110 is connected to the power supply layer and the other is connected to the ground layer. The structure 110 does not need necessarily to be provided in the entire area between the power supply layer and the ground layer in the circuit board 213.

In the example of FIG. 25(*b*), the structure 110 is arranged in a band shape between the semiconductor package 215 as noise source and the noise-sensitive semiconductor package 225. In the example of FIG. 25(*c*), the structure 110 is arranged around the noise-sensitive semiconductor package 225, and in the example of FIG. 25(*d*), the structure 110 is arranged around the semiconductor package 215 as noise source.

In the examples of FIGS. 25(*b*) to 25(*d*), the power supply plane and the ground plane are laid out to be divided by the structure 110 between an part near the semiconductor package 215 as noise source and an other part near the noise-sensitive semiconductor package 225.

In this manner, the structure 110 is arranged, as a noise filter, on a part of or all the parts between the power supply layer and the ground layer, thereby preventing a power supply noise from propagating from the semiconductor package 215 as noise source through the power supply layer and the ground layer in the circuit board 213. Then, an erroneous operation of the noise-sensitive semiconductor package 225 and unwanted electromagnetic radition from the circuit board 213 can be prevented.

Figure 27:
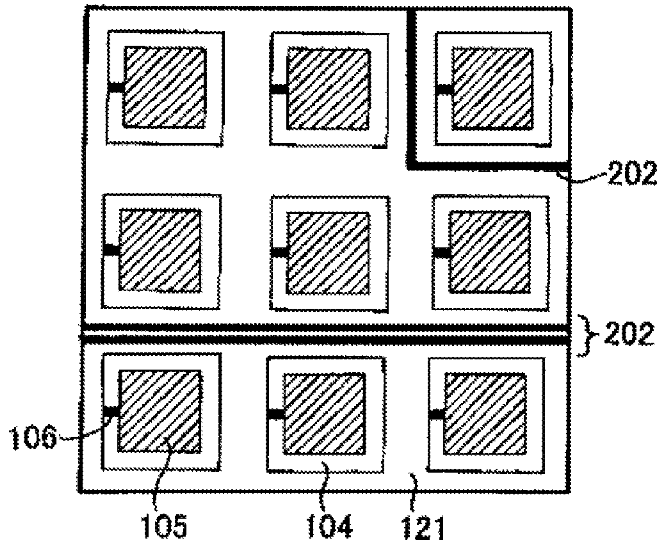
FIG. 27 is a plan view showing the circuit board shown in FIG. 23 viewed from the lower side.

FIG. 27 is a plan view of the circuit board 213 shown in FIG. 23 viewed from its lower side. The Signal line 202 formed in the lower side signal layer 203 extends away from the first opening 104 in the first conductor pattern 121. With the layout, the first conductor pattern 121 functions as a return path of the signal line, thereby preventing the signal quality from deteriorating.

Figure 28:
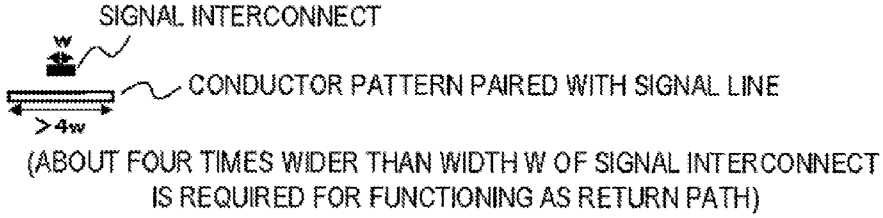
FIG. 28 is a diagram for explaining advantages when the structure functions as a return path of a transmission line.
Figure 28:
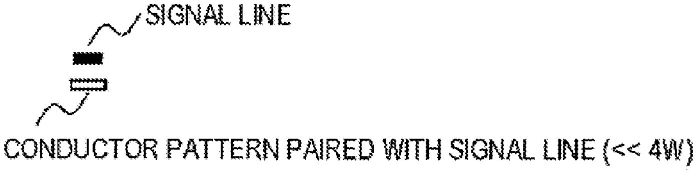

The advantages that the structure 110 functions as a return path of the transmission line will be described with reference to FIG. 28. At first, the second conductor pattern 111 having no first opening 104 functions as a return path without condition.

On the other hand, the first conductor pattern 121 functions as a return path even when the first opening 104 is provided. As shown in FIG. 28(*a*), a condition, that a part positioned between the first openings 104 in the first conductor pattern 121 is wider than the signal line and no slit is present at a part through which the signal line passes, is required. (NG in the case of FIG. 28 (*b*)). In order to cause the first conductor pattern 121 to function as a return path, a part positioned between the first openings 109 in the first conductor pattern 121 needs to be four times wider than the width w of the signal line.

In the case of the conventional inductive grid-type EBG structure having openings, it is so difficult to cause the first conductor pattern 121 to function as a return path of the transmission line. This is because in the case of the conventional inductive grid-type EBG structure, it is assumed that a narrow and long conductor line is used as a conductor pattern for forming an inductance element. In other words, this is because a signal line can step over the slit when laying out the signal line (in the case of FIG. 28 (*b*)) or the conductor pattern paired with the signal line can be narrower as shown in FIG. 28(*b*).

To the contrary, in the structure 110 according to the present embodiment, the first opening 104 can be downsized as described above and thus the conductor width as a return path is ensured to function as a return path of the signal line.

(Fifth Embodiment)

Figure 29:
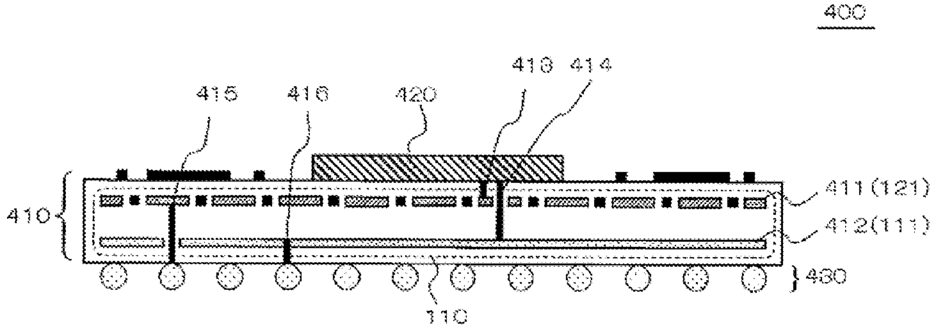
FIG. 29 is a cross-sectional view of an electronic component according to a fifth embodiment.

FIG. 29 is a cross-sectional view of an electronic component according to a fifth embodiment. The electronic component has an interposer 410. In the example shown in the figure, the interposer 410 is configured of four conductor layers. The structure 110 as a noise filter is formed of two internal conductor layers formed inside the interposer 410. The structure 110 is formed on the entire interposer 410 in a plan view but may be provided in the area on which at least a semiconductor chip 420 is mounted, and preferably in its surrounding. The signal layers 203 are formed on the lower side of the second conductor pattern 111 and on the upper side of the first conductor pattern 121 both of which configure the structure 110, respectively. Either one of the first conductor pattern 121 and the second conductor pattern 111 functions as a power supply plane 411 and the other functions as a ground plane 412. In the example shown in the figure, the first conductor pattern 121 functions as the power supply plane 411 and the second conductor pattern 111 functions as the ground plane 412.

In the present embodiment, the semiconductor chip 420 is mounted (flip-chip mounted, for example) on one side of the interposer 410. The semiconductor chip 420 is connected to the power supply plane 411 and the ground plane 412 through vias 413 and 414 provided in the interposer 410. The power supply plane 411 and the ground plane 412 are connected to solder balls 430 provided on the other side of the interposer 410 through vias 415 and 416 provided in the interposer 410. A part of the structure 110 is positioned between the vias 413, 414 and the vias 415, 416 in a plan view. Thus, when the semiconductor chip 420 is a noise source, a noise occurring in the semiconductor chip 420 is blocked by the structure 110 positioned between the vias 413, 414 and the vias 415, 416. Therefore, the noise occurring in the semiconductor chip 420 is prevented from going out of the semiconductor package 400 as a power supply noise. When the semiconductor chip 420 is sensitive to the power supply noise, the power supply noise can be prevented from propagating outside the semiconductor chip 420.

(Sixth Embodiment)

Figure 30:
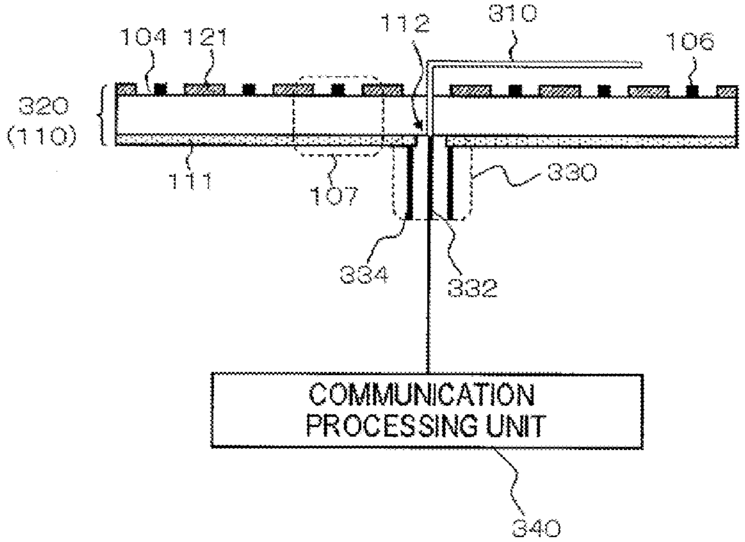
FIG. 30 is a cross-sectional view of an antenna according to a sixth embodiment.

FIG. 30 is a cross-sectional view of an antenna according to a sixth embodiment. The antenna includes an antenna element 310 and a reflective plate 320 provided opposite to the antenna element 310. The reflective plate 320 is configured of the structure 110 shown in any of the first to third embodiments.

In the present embodiment, the structure 110 is used as the EBG-structure. A frequency at which the antenna element 310 makes communication is contained in a stop band (band gap) of the structure 110. The antenna shown in FIG. 30 is a inverted-L antenna. The antenna element 310 is arranged to be opposite to the first conductor pattern 121.

In this case, an electromagnetic wave radiated from the antenna element 310 is reflected in phase on the reflective plate 320 configured of the structure 110. Under the condition, when the antenna element 310 is arranged closer to the surface of the structure 110, the radiation efficiency of the antenna becomes the highest. Thus, the antenna element 310 is arranged to be opposite to the first conductor pattern 121 in the structure 110 so that the inverted-L antenna can be entirely thinned.

In the antenna, a coaxial cable 330 as a power supply line is connected to the backside of the reflective plate 320. Specifically, the opening 112 is provided on the second conductor pattern 111 in the structure 110 and the coaxial cable 330 is attached to the opening. An internal conductor 332 of the coaxial cable 330 extends inside the reflective plate 320 through the opening 112 and is connected to the antenna element 310. An external conductor 334 of the coaxial cable 330 is connected to the second conductor pattern 111.

Then, the coaxial cable 330 is connected to a communication processing unit 340 to configure a communication device.

The embodiments according to the present invention have been described above with reference to the drawing, but are only examples of the present invention and various configurations other than the above may be employed.

DESCRIPTION OF REFERENCE NUMERALS

101 Transmission line
104 First opening
105 Third conductor pattern
106 Line
107 Unit cell
109 Branch line
110 Structure
111 Second conductor pattern
112 Opening
113 Power supply layer
114 Second opening
118 Series resonance circuit
119 One end
121 First conductor pattern
122 Ground layer
129 The other end
202 Signal line
203 Signal layer
204 Microstrip line
205 Coplanar waveguide
206 Ground plane
213 Circuit board
215 Semiconductor package
225 Semiconductor package
310 Antenna element
320 Reflective plate
330 Coaxial cable
332 Internal conductor
334 External conductor
340 Communication processing unit
400 Semiconductor package
410 Interposer
411 Power supply plane
412 Ground plane
413 Via
414 Via
415 Via
416 Via
420 Semiconductor chip
430 Solder ball
500 Chip inductor

The invention claimed is:

1. A structure comprising:

a first conductor;

a second conductor at least partially opposite to the first conductor;

at least one first opening provided in the first conductor;

at least one interconnect provided in the at least one first opening, the at least one interconnect having an open end and being connected to the first conductor, wherein the at least one interconnect and the second conductor define a transmission line through the structure without using a via through the structure, wherein the at least one interconnect, the at least one first opening, and the first conductor are integrally formed; and a plurality of unit cells, each of the plurality of unit cells containing one of the at least one first opening and a corresponding one of the at least one interconnect, wherein the plurality of unit cells are repeatedly arranged within the structure.

2. The structure according to claim 1, wherein the transmission line is a microstrip line.

3. The structure according to claim 1, wherein the at least one interconnect includes at least two interconnects, and lengths of the at least two interconnects are equal.

4. The structure according to claim 1, wherein the at least one interconnect includes at least two interconnects having first and second ends, and the first and second ends of the at least two interconnects are periodically arranged.

5. The structure according to claim 1, wherein the plurality of unit cells each comprises a branch interconnect positioned inside the at least one first opening of the unit cell and branched from the at least one interconnect of the unit cell.

6. The structure according to claim 1, wherein the at least one interconnect extends linearly or in a polygonal line.

7. The structure according to claim 1, wherein the at least one interconnect extends to form a meander, loop, or spiral.

8. The structure according to claim 1, wherein the plurality of unit cells are arranged in two dimensions within the structure.

9. The structure according to claim 1, wherein the plurality of unit cells are arranged in one dimension within the structure.

10. The structure according to claim 1, wherein the plurality of unit cells have the same configuration and the same orientation within the structure.

11. The structure according to claim 1, wherein the at least one first opening is polygonal.

* * * * *